United States Patent [19]

Morimoto et al.

[11] 4,161,418

[45] Jul. 17, 1979

[54] IONIZED-CLUSTER-BEAM DEPOSITION PROCESS FOR FABRICATING P-N JUNCTION SEMICONDUCTOR LAYERS

[75] Inventors: Kiyoshi Morimoto; Yukihiko Utamura, both of Mobara; Toshinori Takagi, Nagaokakyo, all of Japan

[73] Assignee: Futaba Denshi Kogyo K. K., Chiba, Japan

[21] Appl. No.: 908,748

[22] Filed: May 23, 1978

Related U.S. Application Data

[62] Division of Ser. No. 695,645, Jun. 14, 1976, abandoned.

[30] Foreign Application Priority Data

Jun. 27, 1975 [JP] Japan ............................ 50-079414
Jul. 18, 1975 [JP] Japan ............................ 50-087257
Nov. 22, 1975 [JP] Japan ............................ 50-139479

[51] Int. Cl.² .................... H01L 21/203; C23C 15/00
[52] U.S. Cl. .............................. 148/175; 136/89 TF; 148/1.5; 148/174; 204/192 N; 204/192 S; 204/192 EC; 427/39; 427/42
[58] Field of Search .................. 148/1.5, 174, 175; 204/192 N, 192 S, 192 EC, 298; 156/610; 427/38, 39, 42; 136/89 TF

[56] References Cited

U.S. PATENT DOCUMENTS

| | | | |
|---|---|---|---|
| 3,406,040 | 10/1968 | Da Silva et al. | 427/42 |
| 3,583,361 | 6/1971 | Laudel | 204/192 N X |
| 3,912,826 | 10/1975 | Kennedy | 427/38 X |
| 3,974,059 | 8/1976 | Murayama | 204/192 N X |
| 4,091,138 | 5/1978 | Takagi et al. | 427/38 X |
| 4,098,919 | 7/1978 | Morimoto et al. | 204/192 N X |

OTHER PUBLICATIONS

Yano et al., "Ionization of Nitrogen Cluster Beam" Japanese J. of Applied Physics, vol. 14, No. 4, Apr. 1975, pp. 526–532.

Primary Examiner—L. Dewayne Rutledge
Assistant Examiner—W. G. Saba
Attorney, Agent, or Firm—Oblon, Fisher, Spivak, McClelland & Maier

[57] ABSTRACT

A p-n junction type solid-state element having at least a pair of p-n junction type semiconductor layers formed of a p-type semiconductor and an n-type semiconductor joined with each other and a method of producing the same, in which the p-type semiconductor and n-type semiconductor are formed and joined by forming at least one of the semiconductors using what is called the ionized-cluster-beam deposition process which evaporates a material to be deposited to form a vapor, injects the vapor into a vacuum region to form clusters of atoms, ionizes the clusters and electrically accelerates ionized clusters onto a substrate thereby forming a layer thereon.

5 Claims, 10 Drawing Figures

IONIZED-CLUSTER-BEAM DEPOSITION PROCESS FOR FABRICATING P-N JUNCTION SEMICONDUCTOR LAYERS

This is a division of application Ser. No. 695,645, filed June 14, 1976, now abandoned.

BACKGROUND OF THE DISCLOSURE

The present invention relates to a p-n junction type solid-state element for use, for instance, in a film-shaped solar battery, and a method of producing the same.

A typical conventional method of producing a solid-state element having p-n junction type semiconductors for use in a solar battery forms a solid-state element by polishing a single-crystal bulk of, for instance, silicon (Si), and therefore it is very difficult to form a film the thickness of which is on the order of microns. Even if such a film can be produced, the amount of material that can be utilized will be as low as several percent or less of the total.

Moreover, even if the conventional vacuum deposition process or sputtering process is employed to produce such a thin film, it can not be expected to produce a high-quality stable p-n junction type film excellent in crystallinity and suitable for use in a solar battery, and therefore it has problems of being accompanied with poor productivity, poor economy, and expensiveness.

On the other hand, there has been an increasing demand for a solid-state element for use in a solar battery or the like, which is thin-film-shaped, light in weight and easy to transport.

Therefore, the primary object of the present invention is to provide a high-quality p-n junction type solid-state element which can meet the above-mentioned demand and is high in productivity, and to provide a method of producing the same.

SUMMARY OF THE INVENTION

According to the present invention, there is provided a p-n junction type solid-state element having at least a pair of p-n junction type semiconductor layers formed of a p-type semiconductor and an n-type semiconductor joined with each other and a method of producing the same, wherein the p-type semiconductor and n-type semiconductor are formed and joined by forming at least one of said semiconductors using what is called the ionized-cluster-beam deposition process which evaporates a material to be deposited to form a vapor, injects the vapor into a vacuum region of about $10^{-2}$ Torr or less to form clusters of atoms, bombards the clusters with electrons to ionize at least a part of the clusters thereby forming ionized clusters, and accelerates the ionized clusters by an electric field to let them collide with substrate thereby forming a layer thereon.

The above-mentioned ionized-cluster-beam deposition process will be often referred to as the cluster deposition process hereinafter for the sake of simplicity.

Other objects, features and advantages will become more apparent from the following detailed description taken in conjunction with the following drawings in which.

Figure 4:
Figure 5:
Figure 6:
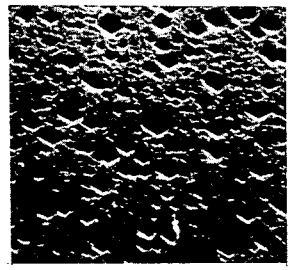
Figure 7:
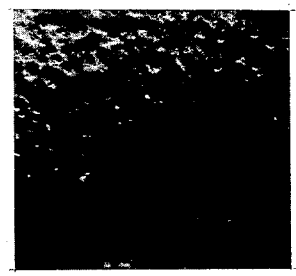
Figure 8:
Figure 9:
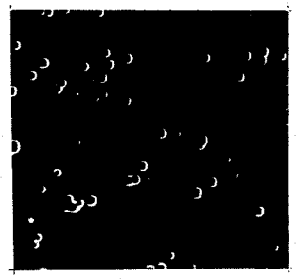
Figure 10:
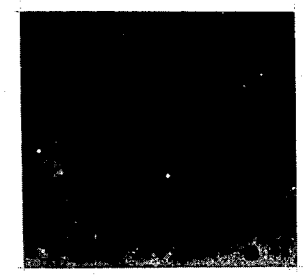

FIGS. 4 and 5 show examples of electron diffraction patterns of the p-type silicon film formed on an n-type silicon substrate according to the process of the present invention in connection with the second embodiment; and FIGS. 6 to 7 show various etch patterns for the sake of comparison, and FIG. 6 is the etch pattern of an n-type silicon substrate before deposition. FIG. 7 is that of the p-type silicon film deposited on an n-type silicon substrate according to the conventional vacuum deposition process, and FIGS. 8 to 10 are the etch patterns of the p-type silicon film deposited on an n-type silicon substrate according to the cluster deposition process of the present invention under different conditions, respectively.

DESCRIPTION OF THE PREFERRED EMBODIMENTS

Now the first embodiment of the p-n junction type solid-state element according to the present invention will be described in detail in conjunction with FIGS. 1 and 2.

Figure 1:
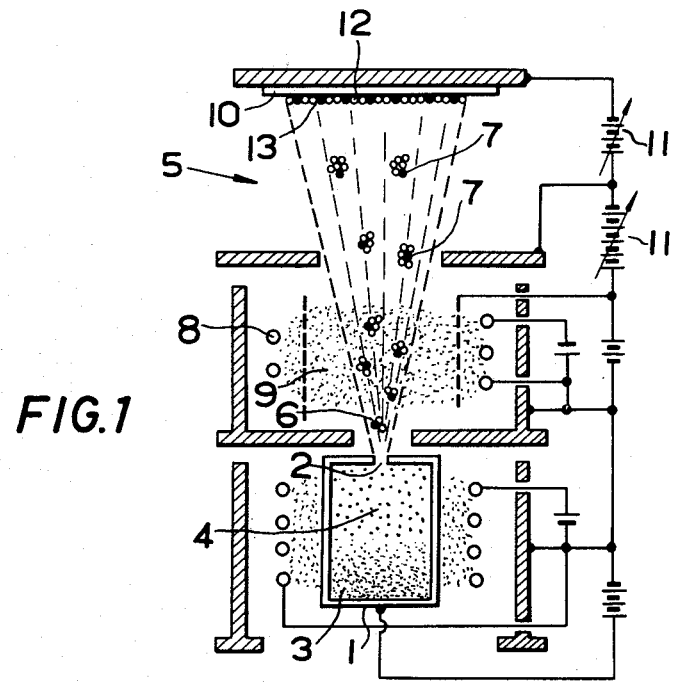
FIG. 1 is a schematical sectional view of an example of the apparatus for carrying out the cluster deposition steps of the method of producing a p-n junction type solid-state element according to the present invention, for explaining the principle thereof.

FIG. 1 is an example of the apparatus for carrying out the cluster deposition process, which is used for producing the p-n junction type solid-state element according to the present invention defining the shape or structure thereof.

In FIG. 1, the reference numeral 1 designates a closed type crucible with at least one injection nozzle 2. The crucible 1 contains material 3 for a film to be deposited, and is heated up to an elevated temperature by suitable heating methods such as resistance heating and electron bombardment heating (as shown in FIG. 1) to vaporize the material 3 to produce vapor 4 whose pressure is about $10^{-2}$ to several Torrs. The vapor 4 is injected through the nozzle 2 into a vacuum region 5 where the pressure is kept at 1/100 or less of the vapor pressure in the crucible 1 and, in addition, at about $10^{-2}$ Torr or less, thereby to form aggregates 6 of atoms of the vapor 4, called clusters, under the influence of supercooling phenomenon due to adiabatic expansion. Usually, one cluster consists of about 100 to 2,000 atoms. If one of a plurality of atoms forming the cluster 6 is ionized, a so-called ionized cluster 7 can be formed. Therefore, a filament 8 is provided as a thermionic emission source for emitting electrons 9, which are made to collide with the neutral clusters 6 thereby to produce the ionized clusters 7. The ionized clusters 7 are moved towards a substrate 10 together with the neutral clusters 6, and are accelerated by an electric field given by acceleration electrodes positioned at and/or near the substrate 10 and connected to an acceleration electric source 11 and thereby come into collision with the surface 12 of the substrate 10. In this case, the surface 12 of the substrate 12 is at all times kept clean because of continuous sputter-cleaning action caused by ionized cluster bombardment, and therefore the resulting deposited film is very clean and very strong in adhesion. In addition, the ionized cluster 7 is small in charge-mass ratio (e/m), and therefore this cluster deposition process can be applied to deposition on the various insulator substrates such as an organic film, which can hardly be carried out by conventional deposition processes, and thus this process can obtain a deposited film very strong in adhesion and very high in purity.

Figure 2:
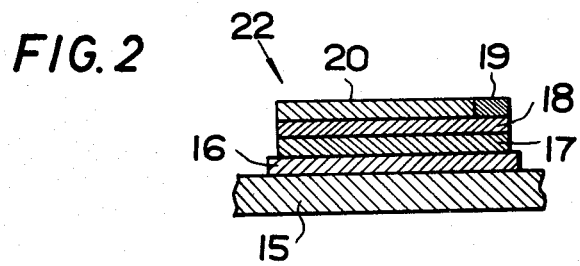
FIG. 2 is a sectional view of the essential part of the p-n junction type solid-state element according to the present invention, showing the first embodiment thereof for explanatory purpose.

Reference is now made to FIG. 2 which is the essential part of the p-n junction type solid-state element according to the present invention showing the first embodiment thereof.

In FIG. 2, the reference numeral 15 designates a substrate which may be formed of various organic films such as polyimide film and Mylar film or may be formed of various thin inorganic films such as glass film. A substrate terminal electrode 16 is a metallic film formed on the upper surface of the substrate 15 by the above-mentioned cluster deposition process so that it may obtain an ohmic contact with respect to a semiconductor layer to be subsequently deposited thereon. A p-type silicon layer 17 and an n-type silicon layer 18 are deposited on the substrate terminal electrode 16 in a laminated manner in this order by the above-mentioned cluster deposition process to form at least a pair of thin films of p-n junction type semiconductor element. This lamination order of the p-type silicon layer 17 and the n-type silicon layer 18 can be reversed as a matter of course. An opposite terminal electrode 19 is a metallic film deposited on the upper semiconductor layer, i.e., the n-type silicon layer 18 (or the p-type silicon layer 17) so that it may obtain an ohmic contact with respect to the semiconductor layer. Materials of metallic films used as the substrate terminal electrode 16 and the opposite terminal electrode 19, which can obtain an ohmic contact with respect to a semiconductor to be in contact therewith may be aluminum, indium, etc. when the semiconductor to be in contact therewith is of p-type silicon, and may be antimony, etc. when the semiconductor to be in contact therewith is of n-type silicon. The silicon film deposited by the cluster deposition process is excellent in crystallinity because the energy of the accelerated ionized clusters is partially converted into thermal energy when the clusters collide with the surface on which they are deposited, and can establish a satisfactory ohmic contact with a metallic film in contact therewith by heat treatment carried out at a temperature far lower than that applied in the case of the conventional processes. In addition, this heat treatment may be carried out either during or after deposition of silicon. The reference numeral 20 designates a reflection preventive layer or film, which may be formed on the upper surface of the semiconductor layer as occasion demands.

In this manner, laminated thin films of high-quality p-n junction type semiconductor elements are provided on the above-mentioned substrate to form a p-n junction type solid-state element 2.

In each step of the above-mentioned cluster deposition process according to the present invention, processing conditions such as the temperature of the substrate, electron current for ionization and acceleration voltage for ionized clusters are properly selected according to the material of the substrate, the surface conditions and depositing material of each layer, etc. so as to optimize the deposited film of each layer, adhesion and strength thereof, etc.

As mentioned above, the substrate 15 for use in producing the p-n junction type element may be made of thin-sheet-shaped or flexible film-shaped organic materials such as Mylar and polyimide, thin-sheet-shaped inorganic materials such as glass and ceramics, thin-sheet-shaped metals, and so on. Therefore, the substrate 15 can be made of a suitable material selected from the above materials according to the purpose, use and the like of the p-n junction type solid-state element to be formed.

As is apparent from the foregoing description, at least the p-type semiconductor layer 17 and the n-type semiconductor layer 18 which form the essential part of the solid-state element are both deposited by the above-mentioned cluster deposition process, and therefore adhere strongly to each other and are naturally completely integrated and very high in quality. Consequently, if the substrate 15 is formed of a flexible film, the solid-state film as a whole can be folded or rolled without any influence on the structure and function of each semiconductor layer.

Furthermore, if not only the above-mentioned semiconductor layers but also either of the substrate terminal electrode 16 and the opposite terminal electrode 19 or both of them are deposited by the cluster deposition process, adhesion between adjacent layers will be further increased and thereby the product quality and production efficiency will be improved as a matter of course.

The reflection preventive layer 20 shown in the above embodiment is intended to provide a light-receiving surface for effectively absorbing light incident thereon from the outside, and is formed on the upper surface of the p-n junction type solid-state element. This reflection preventive layer 20 may be formed by the cluster deposition process used in the present invention or other conventional processes. Furthermore, the opposite terminal electrode 19 deposited by the cluster deposition process may be so formed that it can function as a reflection preventive layer concurrently.

Figure 3:
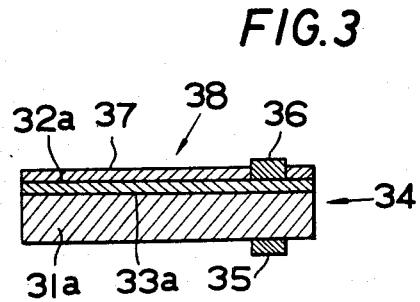
FIG. 3 is a sectional view of the essential part of the p-n junction type solid-state element according to the present invention showing the second embodiment thereof for explanatory purpose.

Reference is now made to FIG. 3, which is a sectional view of the essential part of the p-n junction type solid-state element according to the second embodiment of the present invention. The p-n junction type solid-state element of the second embodiment is used for a solar battery.

In FIG. 3, the reference numeral 31a designates a substrate made of n-type or p-type semiconductor. A crystalline layer 32a made of p-type or n-type semiconductor is formed on the surface 33a of the substrate 31a by the cluster deposition process similar to that applied to the above-mentioned first embodiment so that it may establish a p-n junction with the substrate 31a to form a p-n junction type element portion 34. In addition, a substrate terminal electrode 35, formed of a metal film which can establish an ohmic contact with the semiconductor of the substrate 31a, is formed by the above cluster deposition process at a suitable portion on the substrate 31a where the crystalline layer 32a is not formed. The above deposition step for forming the substrate terminal electrode 35 may be carried out either before or after the deposition step for forming the semiconductor layer 32a having a p-n junction relation with the substrate 31a, as a matter of course. An opposite terminal electrode 36, formed of a metallic film which can establish an ohmic contact with the semiconductor of the layer 32a, is deposited by the above cluster deposition process at a proper portion on the semiconductor layer 32a formed on the substrate 31a and having a p-n junction relation therewith. The metallic films of the terminal electrodes 35 and 36, which are formed in an ohmic contact with the surface of the semiconductor, are preferably made of metals including aluminum and indium when the semiconductor or which they are to be deposited is p-type silicon, and metals including antimony when the semiconductor is n-type silicon.

As mentioned above, the terminal electrodes 35 and 36 are formed on the surfaces of the semiconductor layers 31a and 32a having a p-n junction relation therebetween by the cluster deposition process according to the above-mentioned second embodiment of the present invention. Accordingly, the acceleration energy of the ionized clusters is partially converted into thermal energy when the surfaces of the semiconductor layers 31a and 32a are bombarded with the ionized clusters during deposition, and therefore a very good contact can be obtained between the semiconductor layer 31a or 32a and the terminal electrode 35 or 36 and, in addition, a sufficient ohmic contact can be established therebetween by heat treatment carried out at a temperature far lower than that applied to the conventional processes such as vacuum deposition process. This heat treatment has an advantage in the procedural point of view in that it may be carried out either during or after the deposition stage according to the cluster deposition process.

Reference numeral 37 designates a reflection preventive layer formed on the p-n junction type semiconductor layer. This reflection preventive layer 37 forms a light-receiving surface for effectively absorbing light incident thereon from the outside, and may be formed on the semiconductor layer either by the cluster deposition process applied to the embodiment of the present invention or by other suitable processes. Instead of providing the reflection preventive layer 37, its function may be incorporated into the function of the metallic film of the opposite terminal electrode 36 deposited on the semiconductor layer by the cluster deposition process, by properly selecting the material, conditions, etc. of the metallic film.

Thus, a p-n junction type solid-state element 38 very high in quality can be produced for use in a solar battery.

Reference is now made to FIGS. 4 and 5, which show, by way of example, the electron diffraction patterns of crystal films of p-type silicon deposited on n-type silicon substrates by the deposition process according to the second embodiment of the present invention in which the acceleration voltage for ionized clusters was 4kV and 6 kV, respectively. As seen in these figures, the crystal characteristics of both examples are very fine and, especially, a Kikuch Line indicative of a single crystal is clearly shown in the case of FIG. 5. Thus, it is understood that p-n junction type silicon films having good crystal characteristics can be easily obtained according to the process of this embodiment.

Reference is now made to FIGS. 6 to 10, which show various examples of etch patterns obtained from the surfaces of semiconductor layers in different conditions for the purpose of comparison, and which is intended to clarify the advantages of the process used in the embodiment of the present invention for forming a crystal film of p-type silicon on an n-type silicon substrate.

FIG. 6 shows an etch pattern of an n-type silicon substrate before deposition. FIG. 7 is an etch pattern of a p-type silicon layer deposited on an n-type silicon substrate by the conventional vacuum deposition process, and FIGS. 8, 9 and 10 are etch patterns of p-type silicon layers deposited on n-type silicon substrates by the cluster deposition process applied to the embodiment of the present invention in which the acceleration voltage for ionized clusters was 0 V, 4 kV and 8 kV, respectively. It is understood from these results that no crystallization is observed in the case of the Example shown in FIG. 7 which uses the conventional vacuum deposition process and in the case of the Example shown in FIG. 8 which uses the cluster deposition process but applies no acceleration voltage, and that a good crystallization is observed in the cases of the Examples shown in FIG. 9 and shown in FIG. 10 which use the cluster deposition process according to the embodiment of the present invention and apply the acceleration voltage.

In the step of applying the cluster deposition process according to the embodiment of the present invention mentioned above, the working conditions such as the substrate temperature, electron current for ionization and acceleration voltage for ionized clusters may be properly selected according to the substrate material, desired crystallization state and material of each layer to be deposited, etc. so as to optimize the deposited film of each layer, the adhesion and strength thereof, etc. as a matter of course.

As mentioned above, the present invention can produce at least a p-n junction type solid-state element by letting at least one of an n-type semiconductor and a p-type semiconductor adhere to the other according to the cluster deposition process of the present invention, and therefore has the following various features and effects:

(1) According to the cluster deposition process used in the present invention, deposition is carried out in the presence of sputter-cleaning action caused by bombardment of ionized clusters onto the substrate surface and therefore the depositing surface is at all times kept clean and thus a high-quality deposited film having an excellent adhesion can be obtained.

(2) According to the deposition process of the present invention, ionized clusters are accelerated with a proper high energy given by a high voltage electric field applied, and therefore the energy of the ionized clusters is partially converted into thermal energy to cause a local temperature rise creating the so-called self-heating effect of the deposited film surface when the substrate is bombarded with the ionized clusters; and when collided with the substrate, the ionized clusters and non-ionized neutral clusters are broken up into atomic particles which scatter over the surface of the depositing layer to create the so-called migration effects. Thus the present invention can achieve an excellent crystal growth of the deposited material. Moreover, according to the present invention, crystal growth is controlled by the crystalline state of the substrate semiconductor, and therefore a high-quality p-n junction excellent in crystalline state can be obtained.

(3) The thickness of the crystalline semiconductor-film to be deposited on a substrate so as to obtain a p-n junction can be controlled by properly adjusting the processing conditions of the cluster deposition process, and therefore the semiconductor layer positioned upper than the p-n junction can be made thinner than a conventional process can, and thereby the present invention can obtain excellent effects such as an expansion of the range of wavelength sensitivity to incident rays and an increase in photo voltaic conversion efficiency.

(4) A conventional process diffuses impurities from the surface of a semiconductor to form a function, and therefore a high concentration diffusion region, where recombination of holes and electrons frequently occurs, prevails in the vicinity of the surface of the semiconductor. Consequently, the conventional process has a disadvantage in that it can not effectively take out charged particles created by irradiation of rays. On the other hand, the process of the present invention can control the concentration thereby to eliminate the above disadvantage of the conventional process.

(5) The above-mentioned embodiments are concerned with silicon semiconductors. However, the present invention is not limited to silicon semiconductors alone, but can be applied to other elemental and compound semiconductors such as Ge, GaAs, InP and CdTe to produce p-n junction type elements. In addition, in the case of a compound semiconductor, it is not necessarily required to put the semiconductor itself in the closed type crucible, and a properly mixed component elements of the semiconductor may be put therein.

(6) The present invention can form a thin semiconductor element film high in strength and quality on a flexible organic film to produce a flexible p-n junction type solid-state element, which is almost impossible to produce by a conventional process. Therefore, a number of effects can be expected such as a saving of materials, weight reduction by formation of a thinner film and compactness. Moreover, the flexible p-n junction type solid-state element can be folded or rolled up into a small-sized space without deteriorating its quality, and thus it is very convenient to handle, transport, maintain, etc.

(7) The above embodiments of the present invention show the examples of a pair of semiconductor films having a p-n junction relation with each other. However, the present invention can also produce a multifunction type solid-state element composed of a plurality of pairs of p-n junction type laminated semiconductor layers.

(8) If the substrate terminal electrode on the semiconductor substrate and/or the opposite terminal on the p-n junction type semiconductor layer are also formed by the cluster deposition process as mentioned in the above-mentioned embodiment, they can be easily joined with the respective semiconductors at a treatment temperature far lower than that applied to a conventional process, establishing appropriate ohmic contact therewith. Thus the finished product can be further improved in quality.

(9) By the use of the cluster deposition process, the present invention can produce a high-quality p-n junction type solid-state element easily and highly efficiently, and therefore it will have a number of beneficial effects on productivity, economy, etc.

What is claimed is:

1. A method of producing a p-n junction type solid-state element comprising the steps of:
providing a substrate made of semiconductor material of a first conductivity type;
evaporating semiconductor material of a second conductivity type to form a vapor;
injecting the vapor into a vacuum region of $10^{-2}$ Torr at most to form clusters of atoms;
bombarding the clusters with electrons to ionize at least a part of the clusters, thereby forming ionized clusters; and
accelerating the ionized clusters by an electric field to let the ionized clusters collide with the substrate, thereby coating the substrate with a layer of semiconductor material of the second conductivity type to form a p-n junction therewith.

2. The method of producing a p-n junction type solid-state element recited in claim 1 including the further steps of:
forming a substrate terminal electrode on and in ohmic contact with the substrate; and
forming an opposite terminal electrode on and in ohmic contact with the layer of semiconductor material of the second conductivity type.

3. The method of producing a p-n junction type solid-state element recited in claim 2 wherein the step of forming a substrate terminal electrode includes the steps of:
evaporating a metal to form a metal vapor;
injecting the metal vapor into a vacuum region of $10^{-2}$ Torr at most to form clusters of metal atoms;
bombarding the clusters of metal atoms with electrons to ionize at least a part of the clusters of metal atoms, thereby forming ionized clusters of metal atoms, and
accelerating the ionized clusters of metal atoms by an electric field to let the ionized clusters of metal atoms collide with the substrate, thereby coating the substrate with a metallic film in ohmic contact therewith.

4. The method of producing a p-n junction type solid-state element recited in claim 2 wherein the step of forming an opposite terminal electrode includes the steps of:
evaporating a metal to form a metal vapor;
injecting the metal vapor into a vacuum region of $10^{-2}$ Torr at most to form clusters of metal atoms;
bombarding the clusters of metal atoms with electrons to ionize at least a part of the clusters of metal atoms, thereby forming ionized clusters of metal atoms, and
accelerating the ionized clusters of metal atoms by an electric field to let the ionized clusters of metal ionized clusters of metal atoms collide with the layer of semiconductor material of the second conductivity type, thereby coating the layer of semiconductor material of the second conductivity type with a metallic film in ohmic contact therewith.

5. A method of producing a p-n junction type solid-state element comprising the steps of:
providing a substrate;
coating the substrate with a first metallic film to form a substrate terminal electrode;
evaporating semiconductor material of a first conductivity type to form a vapor;
injecting the vapor into the vacuum region of $10^{-2}$ Torr at most to form clusters of atoms;
bombarding the clusters with electrons to ionize at least a part of the clusters thereby forming ionized clusters;
accelerating the ionized clusters by an electric field to let them collide with the substrate terminal electrode, thereby coating the substrate terminal electrode with a layer of semiconductor material of the first conductivity type in ohmic contact therewith;
repeating the steps of evaporating, injecting, bombarding, and accelerating with a semiconductor material of a second conductivity type, thereby coating the layer of semiconductor material of the first conductivity type with a layer of semiconductor material of the second conductivity type to form a p-n junction therewith; and
coating the layer of semiconductor material of the second conductivity type with a second metallic film in ohmic contact therewith to form an opposite terminal electrode.

* * * * *